(12) United States Patent
Lee et al.

(10) Patent No.: US 9,083,469 B2
(45) Date of Patent: Jul. 14, 2015

(54) DEVICE AND METHOD FOR CONTROLLING LASING WAVELENGTH OF TUNABLE LASER, AND A WAVELENGTH DIVISION MULTIPLEXED-PASSIVE OPTICAL NETWORK HAVING THE SAME

(75) Inventors: Chang-Hee Lee, Daejeon (KR); Sang-Rok Mun, Mokpo-Si (KR); Sang-Min Oh, Gimhae-Si (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 395 days.

(21) Appl. No.: 13/518,340

(22) PCT Filed: Dec. 23, 2010

(86) PCT No.: PCT/KR2010/009292
§ 371 (c)(1),
(2), (4) Date: Dec. 4, 2012

(87) PCT Pub. No.: WO2011/078609
PCT Pub. Date: Jun. 30, 2011

(65) Prior Publication Data
US 2013/0071123 A1    Mar. 21, 2013

(30) Foreign Application Priority Data

Dec. 24, 2009 (KR) .................. 10-2009-0130760
Apr. 13, 2010 (KR) .................. 10-2010-0033891

(51) Int. Cl.
*H04J 14/02* (2006.01)
*H01S 3/10* (2006.01)
(Continued)

(52) U.S. Cl.
CPC ............. *H04B 10/572* (2013.01); *H01S 5/0656* (2013.01); *H04J 14/0213* (2013.01)

(58) Field of Classification Search
CPC ....... H04B 10/572; H04B 10/50; H04J 14/02; H04J 14/0213; H04J 14/0206

USPC ......... 398/82, 79, 95, 182, 93, 184, 195, 196, 398/197, 201, 34, 72, 69, 156; 372/20
See application file for complete search history.

(56) References Cited

U.S. PATENT DOCUMENTS 4,964,131 A * 10/1990 Liu et al. ........................... 372/6
5,027,435 A *  6/1991 Chraplyvy et al. ........... 398/187
(Continued)

FOREIGN PATENT DOCUMENTS

KR    20010077343 A    8/2001
KR    20040031348 A    4/2004
(Continued)

OTHER PUBLICATIONS

Jung-Hyung Moon, et al., "An Automatic Wavelength Control Method of a Tunable Laser for a WDM-PON," IEEE Photon Technol. Lett., (2009) vol. 21, No. 5, pp. 325-327. Referred to on p. 3.
(Continued)

*Primary Examiner* — Ken Vanderpuye
*Assistant Examiner* — Abbas H Alagheband
(74) *Attorney, Agent, or Firm* — Billion & Armitage; Benjamin C. Armitage

(57) ABSTRACT

The present invention discloses a device and method for controlling a lasing wavelength of a tunable laser, and a wavelength division multiplexed-passive optical network having the same.
In a device and method for controlling a lasing wavelength of a tunable laser, and a wavelength division multiplexed-passive optical network having the same, it is possible to improve performance of the wavelength division multiplexed-passive optical network by automatically controlling a lasing wavelength of a tunable laser to be matched with a transmission wavelength of a wavelength division multiplexer/de-multiplexer using optical power or optical beating components obtained by a reflected optical component which is Raleigh backscattered or reflected, and is generated on an optical fiber.

10 Claims, 6 Drawing Sheets

(51) Int. Cl.
*H04B 10/572* (2013.01)
*H01S 5/065* (2006.01)

(56) References Cited

U.S. PATENT DOCUMENTS

| | | | |
|---|---|---|---|
| 6,373,867 B1* | 4/2002 | Lin et al. | 372/18 |
| 6,735,224 B2* | 5/2004 | Murry et al. | 372/20 |
| 6,768,577 B2* | 7/2004 | Eggleton et al. | 359/335 |
| 6,847,477 B2* | 1/2005 | Oron et al. | 359/326 |
| 7,126,971 B2* | 10/2006 | Killinger | 372/20 |
| 7,317,874 B2* | 1/2008 | Li et al. | 398/72 |
| 7,369,774 B2* | 5/2008 | Lee et al. | 398/96 |
| 7,565,084 B1* | 7/2009 | Wach | 398/201 |
| 7,843,629 B2* | 11/2010 | Sorin et al. | 359/337.2 |
| 2002/0154383 A1* | 10/2002 | Oron et al. | 359/326 |
| 2002/0163942 A1* | 11/2002 | Baillargeon et al. | 372/20 |
| 2002/0172237 A1* | 11/2002 | Murry et al. | 372/18 |
| 2002/0196444 A1* | 12/2002 | Nymen et al. | 356/460 |
| 2003/0174387 A1* | 9/2003 | Eggleton et al. | 359/334 |
| 2004/0071181 A1* | 4/2004 | Huang | 372/106 |
| 2004/0105468 A1* | 6/2004 | Killinger | 372/20 |
| 2005/0053103 A1* | 3/2005 | Lo et al. | 372/20 |
| 2005/0129402 A1* | 6/2005 | Kim et al. | 398/79 |
| 2005/0213979 A1* | 9/2005 | Nakashima et al. | 398/79 |
| 2007/0024853 A1* | 2/2007 | Killinger | 356/437 |
| 2007/0223925 A1* | 9/2007 | Ohtani | 398/79 |
| 2007/0286605 A1* | 12/2007 | Feuer et al. | 398/83 |
| 2008/0231943 A1* | 9/2008 | Sorin et al. | 359/336 |
| 2008/0247707 A1* | 10/2008 | Fujii | 385/14 |
| 2009/0074019 A1* | 3/2009 | Wong et al. | 372/26 |
| 2009/0080880 A1* | 3/2009 | Lee et al. | 398/14 |
| 2009/0238228 A1* | 9/2009 | Lu et al. | 372/46.01 |

FOREIGN PATENT DOCUMENTS

| | | | |
|---|---|---|---|
| KR | 20070081062 A | | 8/2007 |
| KR | 100914559 | * | 9/2009 |
| KR | 100914559 B1 | | 9/2009 |
| KR | 20090110565 A | | 10/2009 |

OTHER PUBLICATIONS

International Search Report for corresponding International Application No. PCT/KR2010/009292 mailed on Jul. 1, 2011.

* cited by examiner

DEVICE AND METHOD FOR CONTROLLING LASING WAVELENGTH OF TUNABLE LASER, AND A WAVELENGTH DIVISION MULTIPLEXED-PASSIVE OPTICAL NETWORK HAVING THE SAME

This application is a National Stage Application of PCT/KR2010/009292, filed 23 Dec. 2010, which claims benefit of Ser. No. 10-2010-0033891, filed 13 Apr. 2010 in South Korea, and which also claims benefit of Ser. No. 10-2009-0130760, filed 24 Dec. 2009 in South Korea and which applications are incorporated herein by reference. A claim of priority to all, to the extent appropriate is made.

TECHNICAL FIELD

The present invention relates to a device and method for controlling a lasing wavelength of a tunable laser, and a wavelength division multiplexed-passive optical network having the same. More specifically, the present invention relates to a device and method for controlling a lasing wavelength of a tunable laser, and a wavelength division multiplexed-passive optical network having the same which matches a lasing wavelength of a tunable laser with a transmission wavelength of a wavelength division multiplexer/de-multiplexer by using Raleigh backscattered or reflected light, etc. which is generated on an optical fiber, in order to prevent an optical power loss and performance degradation due to a wavelength mismatch between the transmission wavelengths of the wavelength division multiplexer/de-multiplexer.

BACKGROUND

Demand on a high speed of an access network speed has been increased rapidly as well-known voice telephone and text oriented services have evolved to video and image oriented multimedia services due to a rapid expansion of Internet. Due to such a trend ease of information recognition, it is expected that newly emerging services to be developed in the future will be mostly video oriented multimedia services. Therefore, a next-generation access network is required to have a structure capable of effectively accommodating the video and image oriented multimedia services. Further, it is required to be able to provide a triple play service (TPS), where voice telephone services, data telecommunications services, and high-definition video services are integrated into one service, through one network infrastructure. A wavelength division multiplexed-passive optical network (WDM-PON) is recognized as an ultimate alternative as a method capable of providing protocols to be used for a TPS and a bandwidth with no substantial limit while independently of a transmission speed with subscribers. Generally, since telecommunication is made by using wavelengths which are different from one another depending on respective subscriber in a WDM-PON, it is necessarily required to embody low-cost optical transceiver modules and systems. In addition, the use of a colorless light source is also necessarily required so as for all the subscribers to use a same light source, in order to save installation and maintenance costs of an access network.

studies on a tunable laser have been proceeded in order to embody a colorless light source described above. As one example, an external cavity laser (ECL) may change a lasing wavelength by controlling temperature of a grating. Such an ECL is considered as one possible light source to be used for a WDM-PON, since it can be embodied at relatively low-costs compared with existing lasing lasers. Further, tunable lasers including an ECL described in detail above can be used as light sources, etc. of a WDM optical transmission system being used at a metro network or a backbone network as well as a WDM-PON and thus have a high possibility of application, since they are able to perform modulation at a high speed.

Meanwhile, in order to use the tunable laser described above as a light source of a WDM optical transmission system and a WDM-PON, it is required to match the lasing wavelength of the tunable laser with the transmission wavelength of a wavelength division multiplexer/de-multiplexer. As a specific method and a device for accomplishing such a purpose, Jung-Hyung Moon, et al., for example, suggested a device for controlling a lasing wavelength of a tunable laser published in March of 2009 in an article entitled "An Automatic Wavelength Control Method of a Tunable Laser for a WDM-PON", IEEE Photon. Technol. Lett., vol. 21, no. 5, pp. 325-327. The device for controlling a lasing wavelength of a tunable laser suggested by Jung-Hyung Moon, et al. is directed to a method which transmits incoherent light outputted from a broadband light source (BLS) to a tunable laser, and matches the lasing wavelength of the tunable laser with the transmission wavelength of a wavelength division multiplexer/de-multiplexer by using an optical beating component generated between an optical signal outputted from the tunable laser and the incoherent light. However, an additional BLS is required, and an optical coupler, a reflector, for example, such as a mirror, and a photodiode are required to be used per each channel or each subscriber, in the method disclosed in the article as described above. Since the use of additional equipment causes to increase the costs of a WDM optical transmission system and a WDM-PON, a more cost-effective method is needed.

Besides, in a WDM optical transmission system and a WDM-PON, a method of controlling a lasing wavelength of a tunable laser manually or finding the lasing wavelength using a look-up table has been used in order to match the lasing wavelength of a tunable laser with the transmission wavelength of a wavelength division multiplexer/de-multiplexer. However, such a manual method or a method using a look-up table has a disadvantage that is difficult to embody cost-effectively, because it requires a lot of professional human resources and substantial time.

Accordingly, a new method capable of embodying a WDM optical transmission system and a WDM-PON cost-effectively by controlling a lasing wavelength of a tunable laser automatically.

SUMMARY

The object of the present invention is to solve the prior art problems, by providing a device and method for controlling a lasing wavelength of a tunable laser, and a wavelength division multiplexed-passive optical network having the same which matches a lasing wavelength of a tunable laser with transmission wavelength of a wavelength division multiplexer/de-multiplexer by using Raleigh scattered or reflected light, etc. which is generated on an optical line, in order to prevent an optical power loss and performance degradation due to a wavelength mismatch between the transmission wavelength of the wavelength division multiplexer/de-multiplexer.

According to a first aspect of the present invention, a light outputted from a tunable laser is Rayleigh-backscattered or reflected from an optical fiber or an optical element after passing through a wavelength division multiplexer/de-multiplexer, and then is re-entered into the wavelength division multiplexer/de-multiplexer. It is possible to provide a WDM optical transmission system and a WDM-PON cost-effectively by controlling a lasing wavelength of the tunable laser in a manner that optical power of an optical signal, which is re-entered into the wavelength division multiplexer/de-multiplexer and then outputted therefrom, becomes maximum.

According to a second aspect of the present invention, it is to use either an optical beating between a light outputted from a tunable laser and a light which is Rayleigh backscattered or reflected is used, or an optical beating between a light outputted from an outside light source and a light which is Rayleigh backscattered or reflected by transmitting a light having a wavelength component selected at a wavelength division multiplexer/de-multiplexer to the tunable laser, while placing a low-cost light source (a low-power multiple wavelength light source or a low-power broadband light source) in front of the wavelength division multiplexer/de-multiplexer. After that, an optical beating is made and then beating components (i.e., noise or frequency difference) are measured. After that, a lasing wavelength of the tunable laser is to be matched with a wavelength of a light of an injected light source, by controlling the lasing wavelength of the tunable laser in a manner that a wavelength difference between the two lights becomes minimum.

According to a third aspect of the present invention, the present invention controls a lasing wavelength of a tunable laser by using a photodiode and a wavelength identifier, which are independent components, for measuring a difference between a wavelength of a light of a light source which is injected from outside and the lasing wavelength of the tunable laser, and interference noise (beating noise). Alternatively, a single optical wavelength measuring device or a single optical spectrum analyzer can be used as a device for measuring a wavelength or frequency difference between two lights in the present invention.

Using a device and method for controlling a lasing wavelength of tunable laser, and a wavelength division multiplexed-passive optical network having the same of the present invention, the following advantages are accomplished:

1. Since the lasing wavelength of a tunable laser are automatically controlled to match with the transmission wavelength of a wavelength division multiplexer/de-multiplexer, a lot of professional human resources and time for finding the lasing wavelength of a tunable laser are be significantly saved.

2. Since the lasing wavelength of a tunable laser are automatically controlled to match with the transmission wavelength of a wavelength division multiplexer/de-multiplexer, performance degradation of a WDM optical transmission system and a WDM-PON due to a mismatch between the lasing wavelength and the transmission wavelength is possibly prevented.

3. Since the lasing wavelength are controlled by using a Raleigh backscattered or reflected optical component of an optical outputted from a tunable laser, it is easy to embody a WDM optical transmission system and a WDM-PON in a cost-effective way.

Further features and advantages of the present invention can be obviously understood with reference to the accompanying drawings where same or similar reference numerals indicate same components.

DETAILED DESCRIPTION

Hereinafter, the present invention will be described in more detail with reference to the embodiments of the present invention and the appended drawings.

Figure 1:
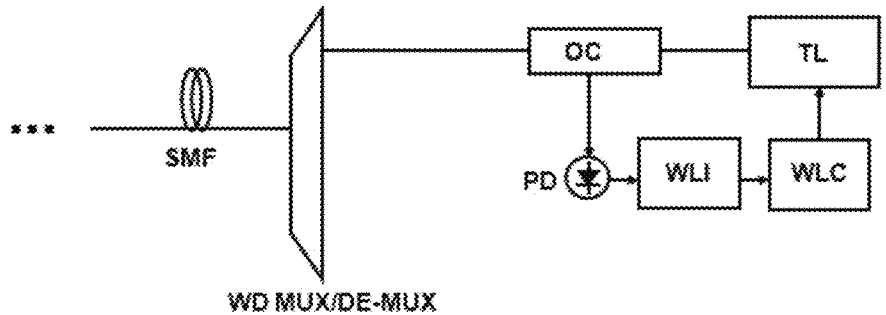
FIG. 1 illustrates a view of schematic block diagram for explaining a structure and its operations of a device for controlling a lasing wavelength of a tunable laser to be matched with transmission wavelength of a wavelength division multiplexer/de-multiplexer by using a backscattered or reflected optical component generated from a single mode fiber, according to a first embodiment of the present invention.

FIG. 1 illustrates a view of schematic block diagram for explaining a structure and its operations of a device for controlling a lasing wavelength of a tunable laser to be matched with transmission wavelength of a wavelength division multiplexer/de-multiplexer by using a backscattered or reflected optical component generated from a single mode fiber, according to a first embodiment of the present invention.

Referring to FIG. 1, a device for controlling a lasing wavelength of a tunable laser according to a first embodiment of the present invention comprises a wavelength division multiplexer/de-multiplexer (WD MUX/DE-MUX); a single mode fiber (SMF) being connected to the WD MUX/DE-MUX; a tunable laser (TL) for outputting a first light to the WD MUX/DE-MUX; an optical coupler (OC), being provided between the WD MUX/DE-MUX and the TL, for receiving and outputting the first light and for being inputted and outputting an optical component of the first light which is backscattered or reflected from the SMF (hereinafter being referred to "reflected optical component"); a photodiode (PD), being connected to the OC, for converting the reflected optical component into an electric signal upon receipt thereof and outputting the converted electric signal; a wavelength identifier (WLI), being connected to the PD, for identifying the lasing wavelength of the TL upon receipt of the converted electric signal and outputting an indentifying signal; and a wavelength controller (WLC), being connected to the WLI, for controlling the wavelengths of the TL upon receipt of the indentifying signal.

More specifically, the first light outputted from the TL illustrated in FIG. 1 passes through the OC and then is multiplexed at the WD MUX/DE-MUX. At this time, the first light passes through the WD MUX/DE-MUX and then is transmitted to the SMF if the lasing wavelength of the TL match with the transmission wavelength of the WD MUX/DE-MUX, while the first light is not transmitted to the SMF if the lasing wavelength of the TL mismatch with the transmission wavelength of the WD MUX/DE-MUX. Once a signal of the first light (hereinafter being referred to "a first optical signal") is inputted into the SMF, a reflected optical component is generated in a reverse direction to the input direction of the first optical signal due to non-uniformity of the SMF. The reflected optical component is again re-inputted into the WD MUX/DE-MUX, and then is de-multiplexed and transmitted to the OC. After that, the reflected optical component transmitted to the optical coupler is inputted into the PD. The PD converts the received, reflected optical component into an electric signal, and then outputs the converted electric signal to the WLI. The WLI identifies the difference between the lasing wavelength of the TL and the transmission wavelength of the WD MUX/DE-MUX by using the electric signal, and then transmits an identifying signal to the WLC. After that, the WLC matches the lasing wavelength of the TL with the transmission wavelength of the WD MUX/DE-MUX, upon receipt of the identifying signal. In this manner, the lasing wavelength of the TL is controlled to be matched with the transmission wavelength of the WD MUX/DE-MUX.

In a first embodiment illustrated in FIG. 1 as described above, the WLI identifies the lasing wavelength of the TL by using, for example, a maximum power characteristic upon receipt of the converted electric signal, and outputs an identifying signal so that it is able to control the lasing wavelength of the TL. That is, in case that the lasing wavelength of the TL match the transmission wavelength of the WD MUX/DE-MUX, the intensity of the reflected optical component of the first light, which is inputted into the PD and is backscattered or reflected, becomes maximum. The WLI identifies that the lasing wavelength of the TL mach the transmission wavelength of the WD MUX/DE-MUX at the moment that the power of the electric signal outputted from the PD becomes maximum, and transmits the identifying signal to the WLC so as to match the lasing wavelength of the TL with the transmission wavelength of the WD MUX/DE-MUX.

Figure 2:
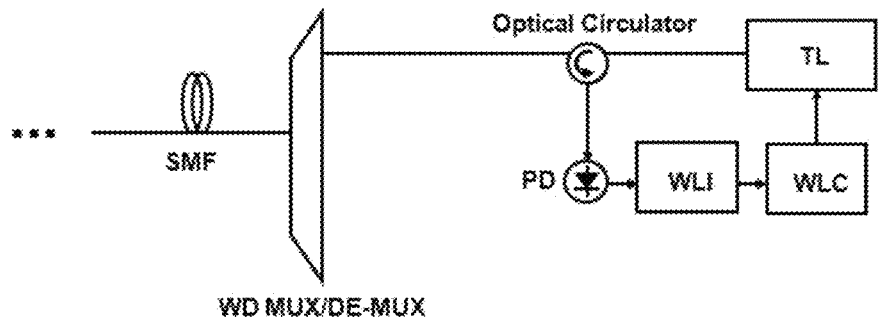
FIG. 2 illustrates a view of schematic block diagram for explaining a structure and its operations of a device for controlling a lasing wavelength of a tunable laser, according to an alternative embodiment of the first embodiment of the present invention illustrated in FIG. 1.

FIG. 2 illustrates a view of schematic block diagram for explaining a structure and its operations of a device for controlling a lasing wavelength of a tunable laser, according to an alternative embodiment of the first embodiment of the present invention illustrated in FIG. 1.

Referring to FIG. 2, the alternative embodiment of the present invention illustrated in FIG. 2 has a structure that is substantially the same as the first embodiment illustrated in FIG. 1, except that an optical circulator is used instead of an optical coupler in the alternative embodiment. Accordingly, a detailed explanation on a specific structure and its operations of the alternative embodiment of the present invention illustrated in FIG. 2 is omitted herein.

Figure 3:
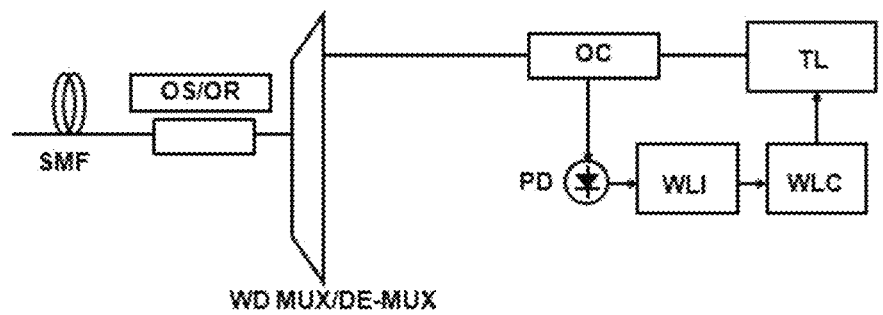
FIG. 3 illustrates a view of schematic block diagram for explaining a structure and its operations of a device for controlling a lasing wavelength of a tunable laser, according to another alternative embodiment of the first embodiment of the present invention illustrated in FIG. 1.

FIG. 3 illustrates a view of schematic block diagram for explaining a structure and its operations of a device for controlling a lasing wavelength of a tunable laser, according to another alternative embodiment of the first embodiment of the present invention illustrated in FIG. 1.

Referring to FIG. 3, the another alternative embodiment of the present invention has a structure that is substantially the same as the first embodiment illustrated in FIG. 1, except that an optical splitter/reflector is provided between the WD MUX/DE-MUX and the SMF in the another alternative embodiment. More specifically, once the first light, which is multiplexed at the WD MUX/DE-MUX illustrated in FIG. 3, is inputted into the optical splitter/reflector (OS/OC), a portion of the inputted first light is transmitted to the SMF and backscattered or reflected so that a first reflected light is generated. Further, another portion of the first light which is inputted into the OS/OC is reflected therefrom so that a second reflected light is generated. The OS/OC combines the first reflected light and the second reflected light and re-inputs the combined reflected light into the WD MUX/DE-MUX.

Figure 4:
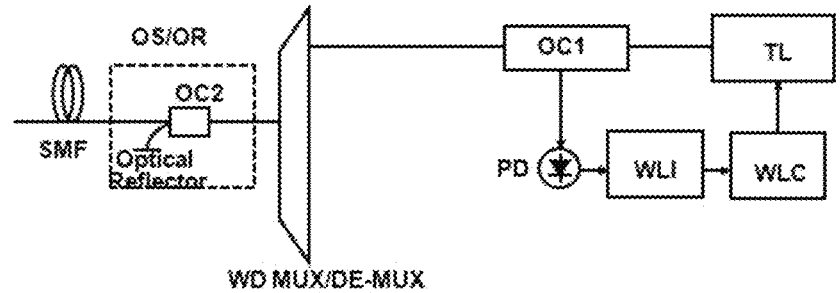
FIG. 4 illustrates a view of schematic block diagram for explaining a structure of an optical splitter/reflector in more detail, according to an embodiment of the present invention illustrated in FIG. 3.

FIG. 4 illustrates a view of schematic block diagram for explaining a structure of an optical splitter/reflector in more detail, according to an embodiment of the present invention illustrated in FIG. 3.

Referring to FIG. 4, the optical splitter/reflector (OS/OC) illustrated in FIG. 3 comprises a second optical coupler (OC2) and an optical reflector in the embodiment of FIG. 4. More specifically, the OS/OC illustrated in FIG. 4 can be embodied by an OC2, for example, such as a 1×2 optical coupler having three input/output ports and an optical reflector, for example, such as a mirror. The OC2 has a first input/output port provided at one side and a second and a third input/output ports provided at the other side which is opposite to the one side. The first input/output port is connected to the WD MUX/DE-MUX, the second input/output port is connected to the SMF, and the third input/output port is connected to the optical reflector. The first light outputted from the TL passes through a first optical coupler (OC1) and is inputted into the WD MUX/DE-MUX. The first light outputted from the WD MUX/DE-MUX is inputted into the OC2 through the first input/output port. A portion of the inputted first light (a first portion) is transmitted to the SMF through the second input/output port and is backscattered or reflected from the SMF so that a first reflected light is generated. The first reflected light is inputted into the OC2 through the second input/output port and is outputted to the WD MUX/DE-MUX through the first input/output port. Another portion of the first light (a second portion) inputted into the first input/output port of the OC2 is transmitted to the optical reflector through a third input/output port, and a second reflected light, which is reflected from the optical reflector, is generated. The second reflected light is inputted into the OC2 through the third input/output port and is outputted into the WD MUX/DE-MUX through the first input/output port. The first reflected light and the second reflected light which are re-inputted into the WD MUX/DE-MUX are de-multiplexed and are transmitted to the OC1.

In the first embodiment and its alternative embodiments of the present invention illustrated in FIGS. 1, 2, 3, and 4, a method of matching the lasing wavelength of the TL with the transmission wavelength of the WD MUX/DE-MUX by directly using a reflected optical component which is generated from the SMF due to a Rayleigh backscattering or reflection. However, the intensity of the reflected optical component which is Rayleigh backscattered or reflected is relatively small and thus has an disadvantage that sensitivity is low. Further, in another alternative embodiment of the present invention illustrated in FIGS. 3 and 4, there is a disadvantage that system performance may be degraded by the OS/OC used for increasing the intensity of the reflected optical component. It is possible to match the lasing wavelength of the TL with the transmission wavelength of the WD MUX/DE-MUX by using optical beating components between the reflected optical component, which is Rayleigh backscattered or reflected, and other lights, in order to compensate the disadvantage described in detain above without degradation of the system performance.

Figure 5:
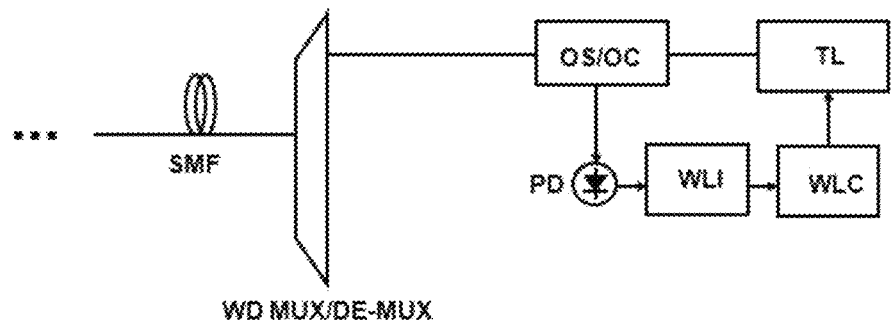
FIG. 5 illustrates a view of schematic block diagram for explaining a structure and its operations of a device for controlling a lasing wavelength of a tunable laser to be matched with transmission wavelength of a wavelength division multiplexer/de-multiplexer by using a backscattered or reflected optical component generated from a single mode fiber, according to a second embodiment of the present invention.

More specifically, FIG. 5 illustrates a view of schematic block diagram for explaining a structure and its operations of a device for controlling a lasing wavelength of a tunable laser to be matched with transmission wavelength of a wavelength division multiplexer/de-multiplexer by using a backscattered or reflected optical component generated from a single mode fiber, according to a second embodiment of the present invention.

Referring to FIG. 5, a device for controlling a lasing wavelength of a tunable laser according to a second embodiment of the present invention comprises a wavelength division multiplexer/de-multiplexer (WD MUX/DE-MUX); a single mode fiber (SMF) connected to the WD MUX/DE-MUX; a tunable laser (TL) for outputting a first light into the WD MUX/DE-MUX; an optical splitter/combiner (OS/OC), being provided between the WD MUX/DE-MUX and the TL, for receiving and splitting the first light and a reflected optical component of the first light, which is backscattered or reflected from the SMF, and for combining a potion of the first light and the reflected optical component and outputting a combined light; a photodiode (PD), being connected to the OS/OC, for converting the combined light into an electric signal upon receipt thereof, and for outputting the converted electric signal; a wavelength identifier (WLI), being connected to the PD, for identifying a lasing wavelength of the TL by using optical beating components between the first light and the reflected optical component upon receipt of the converted electric signal and for outputting an identifying signal; and a wavelength controller (WLC), being connected to the WLI, for controlling the lasing wavelength of the TL upon receipt of the identifying signal.

Hereinafter, a structure of a device for controlling a lasing wavelength of a tunable laser according to a second embodiment of the present invention and a principle where the lasing wavelength are automatically controlled will be described in more detail.

Referring back again to FIG. 5, a portion of the first light (hereinafter being referred to "a first portion"), which is outputted from the tunable laser, is transferred to the WD MUX/DE-MUX through an optical splitter/combiner, while the remaining portion thereof (hereinafter being referred to "a second portion") is transferred to the PD through the optical splitter/combiner. In case that the lasing wavelength of the TL match with the transmission wavelength of the WD MUX/DE-MUX, the first portion of the first light transmits the WD MUX/DE-MUX and then is transferred to the SMF, while in case that the lasing wavelength of the TL do not match with the transmission wavelength of the WD MUX/DE-MUX, the first portion of the first light is not transferred to the SMF. When optical signals of the first portion of the first light is inputted into the SMF, a reflected optical component, which is Rayleigh backscattered or reflected in a reverse direction to an input direction of the first portion, is generated due to non-uniformity of the SMF. Thus, the reflected optical component of the first light is re-inputted again into the WD MUX/DE-MUX and then is transferred to the optical splitter/combiner. After that, the reflected optical component, which is transferred to the optical splitter/combiner, is inputted into the PD. Thus, the second portion of the first light which is outputted from the TL and the reflected optical component of the first light, which is Rayleigh backscattered or reflected from the SMF, is inputted in PD, and an optical beating component is generated, depending on a wavelength (or frequency) difference between the inputted two lights (i.e., the second portion of the first light and the reflected optical component of the first light). Such an optical beating component is transferred to the WLI, and the WLI measures the optical beating components and determines the wavelength difference between the wavelengths of the first light and the transmission wavelength of the WD MUX/DE-MUX. The wavelength difference identified by the WLI is transferred to the WLC, and the WLC controls the lasing wavelength of the TL by using the identified wavelength difference. The WLI can be embodied by using, for example, a low pass filter or a band pass filter (BPF), etc. where it is possible to identify the wavelength difference by measuring an electric signal which passes through a pass band of such filters.

Figure 6:
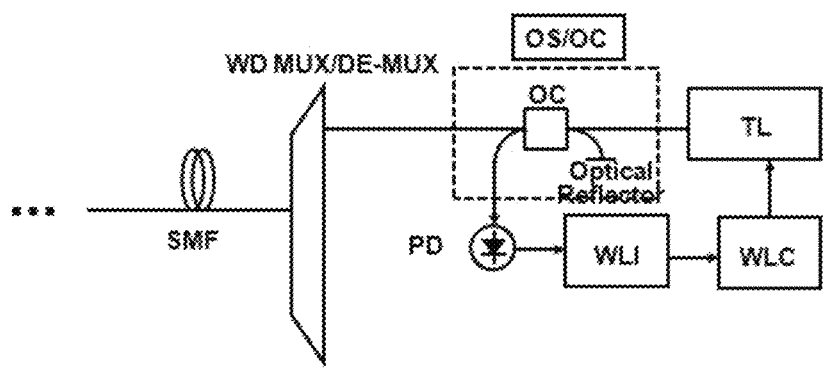
FIG. 6 illustrates a view of schematic block diagram for explaining a structure and its operations of a device for controlling a lasing wavelength of a tunable laser in more detail, according to a second embodiment of the present invention illustrated in FIG. 5.

FIG. 6 illustrates a view of schematic block diagram for explaining a structure and its operations of a device for controlling a lasing wavelength of a tunable laser in more detail, according to a second embodiment of the present invention illustrated in FIG. 5. In an embodiment illustrated in FIG. 6, the optical splitter/combiner illustrated in FIG. 5 is comprised of an optical coupler and an optical reflector.

Referring to FIG. 6, a device for controlling a lasing wavelength of a tunable laser which automatically matches the lasing wavelength of the TL with transmission wavelength of a WD MUX/DE-MUX, according to a second embodiment of the present invention, comprises an optical splitter/combiner (OS/OC) which can be embodied by a 2×2 optical coupler having four input/output ports and am optical reflector (for example, a mirror). More specifically, the 2×2 optical coupler used for the present invention has a first and a second input/output ports which are provided at one side, and a third and a fourth input/output ports which are provided at the other side which is opposite to one side. The first input/output port is connected to the WD MUX/DE-MUX, and the second input/output port is connected to the PD. In addition, the third input/output port is connected to the TL, and the fourth input/output port is connected to the optical reflector. The first light outputted from the TL is inputted into the 2×2 optical coupler through the third input/output port, and a portion (the first portion) of the inputted first light is outputted to the WD MUX/DE-MUX through the first input/output port, while the remaining portion (the second portion) thereof is inputted into PD through the second input/output port. The first portion of the first light, which is inputted into the WD MUX/DE-MUX, is inputted into the SMF, a reflected optical component, which is Rayleigh backscattered or reflected from the SMF, is generated. The reflected optical component is re-inputted again into the WD MUX/DE-MUX, and then is inputted into the first input/output port of the 2×2 optical coupler. A portion of the reflected optical component which is inputted into the first input/output port is outputted to the TL through the third input/output port, the remaining portion thereof is outputted to the optical reflector which is connected to the fourth input/output port. The remaining portion of the reflected optical component which is reflected from the optical reflector is re-inputted again into the 2×2 optical coupler through the fourth input/output port. After that, the remaining portion of the reflected optical component which is reflected from the optical reflector is inputted into the PD through the input/output port. Thus, the first portion of the first light and the remaining portion of the reflected optical component of the first light backscattered or reflected from the SMF are inputted together into the PD. That is, the optical splitter/combiner, being used for a device for controlling the lasing wavelength of the TL according to the second embodiment of the present invention as illustrated in FIG. 6, divides and combines two lights (the first light and the reflected optical component of the first light), which are inputted in reverse directions from each other, and inputs them together into the PD.

In the second embodiment of the present invention illustrated in FIGS. 5 and 6, a method of matching the lasing wavelength of the TL with the transmission wavelength of the WD MUX/DE-MUX by using an optical beating component between the reflected optical component of the first light which is backscattered or reflected from the SMF and the first light outputted from the TL. In the first and second embodiments described in detail above, there is a disadvantage that the performance of the device for controlling the lasing wavelength is more degraded as the reflection generated at a front facet of the WD MUX/DE-MUX and the reflection generated from the optical coupler or the optical circulator (i.e., the reflection that is generated regardless of the fact whether the first light passes the WD MUX/DE-MUX or not) become increasing. In order to solve the above disadvantage, a method of modulating the TL may be used.

Figure 7:
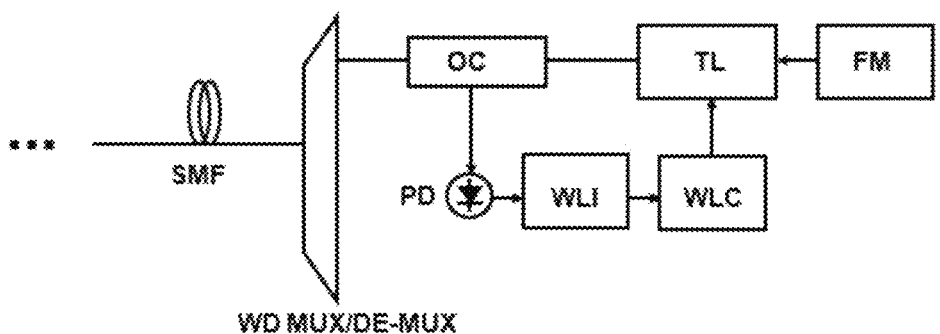
FIGS. 7 and 8 illustrate respectively a view of schematic block diagram and principles for explaining a structure and its operations of a device for controlling a lasing wavelength of a tunable laser, according to a third embodiment of the present invention, which is an alternative embodiment to the first and second embodiments of the present invention.
Figure 8:
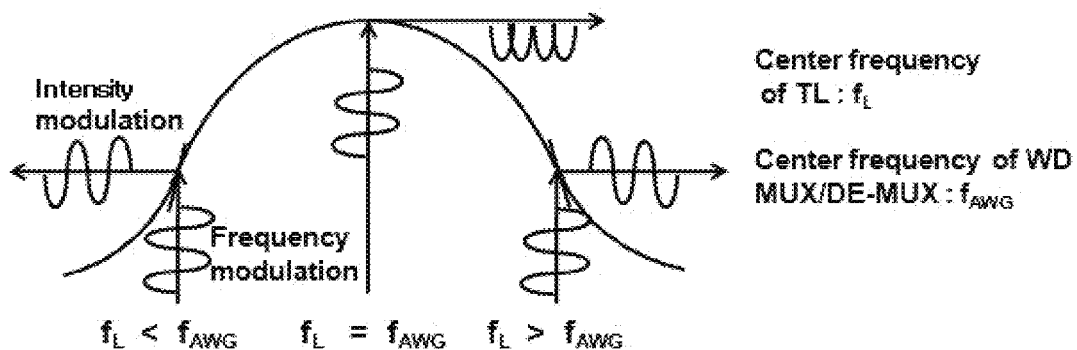

FIGS. 7 and 8 illustrate respectively a view of schematic block diagram and principles for explaining a structure and its operations of a device for controlling a lasing wavelength of a tunable laser, according to a third embodiment of the present invention, which is an alternative embodiment to the first and second embodiments of the present invention.

Referring to FIG. 7, a third embodiment of the present invention includes a structure which is substantially the same as the first embodiment of the present invention, except the fact that a frequency modulator is added. The frequency modulator illustrated in FIG. 7 modulates a frequency of the first light by a first frequency. Here, the first light which is frequency-modulated by the first frequency is referred to a first modulated light. A third alternative embodiment of the present invention uses a characteristic that the first modulated light is amplitude-modulated for the first frequency to have two-time maximum values, when the first modulated light passes through the WD MUX/DE-MUX.

More specifically, referring to FIG. 8, if a central frequency ($F_L$) or a central wavelength of the first modulated light matches with a transmission frequency ($F_{AWG}$) or a transmission wavelength of the WD MUX/DE-MUX (for example, in case of $F_L = F_{AWG} = 100$ MHz), the first frequency of the first modulated light is farthest away from the transmission frequency ($F_{AWG}$) of the MUX/DE-MUX when it has a minimum frequency or a maximum frequency (for example, in case that the first frequency has a range of 99 to 101 MHz, while the frequency of the first modulated light is either 101 MHz or 99 MHz) so that optical power becomes minimum. Further, if the frequency of the first modulated light matches with the transmission frequency ($F_{AWG}$) of the WD MUX/DE-MUX (for example, 100 MHz from the above example), the optical power becomes maximum. Thus, the optical power has two-time amplitude modulations (from the above example, the optical power varies as minimum→maximum→minimum→maximum→minimum) for one modulation period of the first frequency (for example, a period that the first frequency of the first modulated light varies as 101 MHz→100 MHz→99 MHz→100 MHz→101 MHz from the above example) (See a horizontal amplitude modulation in case of $F_L = F_{AWG}$ illustrated in FIG. 8). As backscattering or reflection is generated after passing through the MUX/DE-MUX, the optical power of the first frequency of the first frequency of the first modulated light in the reflected optical component of the backscattered or reflected first light, which is inputted into the PD, has two-time maximum values, in case that the lasing wavelength of the TL matches with the transmission wavelength of the MUX/DE-MUX. In case that the WLI divides and senses the first frequency component, which is outputted from the PD, so that it detects a maximum value two times, then it transmits an identifying signal which identifies that the lasing wavelength of the TL matches with the transmission wavelength to the WLC. The WLI matches the lasing wavelength of the TL with the transmission wavelength of the WD MUX/DE-MUX.

Referring back to FIG. 8, if the center frequency ($F_L$) of the first modulated light is larger than the transmission frequency ($F_{AWG}$) (for example, in case that $F_L = 100$ MHz, and $F_{AWG} = 99$ MHz), the first frequency of the first modulated light moves farther away from the transmission frequency ($F_{AWG}$) as the first frequency of the first modulated light increases, for example, from 100 MHz to 101 MHz so that the optical power decreases, and the first frequency of the first modulated light moves closer to the transmission frequency ($F_{AWG}$) as the first frequency of the first modulated light decreases, for example, from 100 MHz to 99 MHz so that the optical power increases. In this case, the optical power of the first frequency has one-time maximum value, and the phases between the first light with a frequency modulation and the backscattered or reflected light with an amplitude-modulation have a difference with 180 degrees. Herein, the difference with 180 degrees means that a relationship between a change in term of increasing or decreasing in frequency of the first modulated light and a change in terms of increasing or decreasing in the transmission frequency ($F_{AWG}$) of the WD MUX/DE-MUX is exactly opposite from each other. On the contrary, if the center frequency ($F_L$) of the first modulated light is smaller than the transmission frequency (FAWG) (for example, in case that $F_L = 100$ MHz, and $F_{AWG} = 101$ MHz), the first frequency of the first modulated light moves closer to the transmission frequency ($F_{AWG}$) as the first frequency of the first modulated light decreases, for example, from 100 MHz to 101 MHz so that the optical power increases, and the first frequency of the first modulated light moves farther away from the transmission frequency ($F_{AWG}$) as the first frequency of the first modulated light decreases, for example, from 100 MHz to 99 MHz so that the optical power decreases. In this case, the phases between the first modulated light and the backscattered or reflected light with an amplitude-modulation are the same. Herein, the same phases mean that a relationship between a change in term of increasing or decreasing in frequency of the first modulated light and a change in terms of increasing or decreasing in the transmission frequency ($F_{AWG}$) of the WD MUX/DE-MUX matches from each other. Thus, the WLI divides and senses the first frequency component, which is outputted from the PD, and then detects a maximum value of optical power one time, it may identify whether the frequency or wavelength of the TL is increased or decreed by measuring the phase of the backscattered or reflected light when using a phase characteristic between the first modulated light and the backscattered or reflected light with an amplitude-modulation. The frequency modulator according to the third embodiment of the present invention illustrated in FIG. 7 as described above, may either use a wavelength controller or modulate the frequency of the TL by itself.

Figure 9:
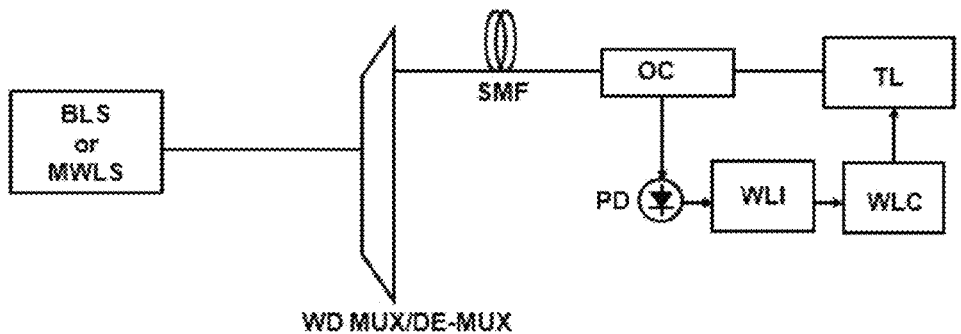
FIG. 9 illustrates a view of schematic block diagram for explaining a structure and its operations of a device for controlling a lasing wavelength of a tunable laser to be matched with transmission wavelength of a wavelength division multiplexer/de-multiplexer by using an optical beating component between light outputted from an external light source being placed outside and a backscattered or reflected optical component generated from a single mode fiber, according to a fourth embodiment of the present invention.

FIG. 9 illustrates a view of schematic block diagram for explaining a structure and its operations of a device for controlling a lasing wavelength of a tunable laser to be matched with transmission wavelength of a wavelength division multiplexer/de-multiplexer by using an optical beating component between light outputted from an external light source being placed outside and backscattered or reflected optical component generated at a single mode fiber, according to a fourth embodiment of the present invention.

Referring to FIG. 9, a device for controlling a lasing wavelength of a tunable laser according to the fourth embodiment of the present invention comprises a light source for outputting a second light; a wavelength division multiplexer/de-multiplexer (WD MUX/DE-MUX) for de-multiplexing the second light being outputted from the light source; a single mode fiber (SMF) being connected to the WD MUX/DE-MUX; a tunable laser (TL) for outputting a first light to the WD MUX/DE-MUX; an optical coupler (OC), being provided between the WD MUX/DE-MUX and the TL, for outputting a combined light by combining a portion of the de-multiplexed second light, a reflected optical component of the first light being backscattered or reflected from the SMF, and a portion of the first light being reflected from the WD MUX/DE-MUX; a photodiode (PD), being connected to the OC, for converting the combined light into an electric signal upon receipt thereof and for outputting the converted electric signal; a wavelength identifier (WLI), being connected to the PD, for identifying a lasing wavelength of the TL by using noise of optical beating components or a frequency difference between the reflected optical component and the de-multiplexed second light upon receipt of the converted electric signal and for outputting an identifying signal; and a wavelength controller (WLC), being connected to the WLI, for controlling the lasing wavelength of the TL upon receipt of the identifying signal.

Hereinafter, a structure of a device for controlling a wavelength of the TL according to the fourth embodiment of the present invention and a principle that the lasing wavelength is automatically controlled will be described in more detail.

Referring back to FIG. 9, the second light outputted from the light source (for example, a multiple-wavelength light source or a broadband light source) is de-multiplexed by the WD MUX/DE-MUX. The second light which is de-multiplexed at the WD MUX/DE-MUX is inputted into the photodiode by the optical coupler. Further, the first light outputted from the TL passes through the optical coupler and the WD MUX/DE-MUX, and then is transmitted to the SMF. At this time, the first light experiences Rayleigh backscattering or reflection which is generated from the SMF, or reflection which is generated from the WD MUX/DE-MUX or a connector (not shown), etc. and a reflected optical component is re-inputted into the optical coupler and then is inputted into the photodiode. Thus, a portion of the second light outputted from the light source and the reflected optical component are inputted into the PD, and an optical beating component is generated depending on a wavelength (or frequency) difference between the reflected optical components of the second and first lights. The PD transfers the optical beating component to the WLI, and the WLI measures the frequency difference or noise of the optical beating component and then identifies the wavelength difference between the first and second lights. The wavelength difference identified by the WLI is transferred to the WLC. The WLC controls the lasing wavelength of the tunable laser by using the identified wavelength difference. The WLC can be embodied by using, for example, a low pass filter or a band pass filter (BPF), etc. where it is possible to identify the wavelength difference by measuring an electric signal which passes through a pass band of such filters.

Figure 10:
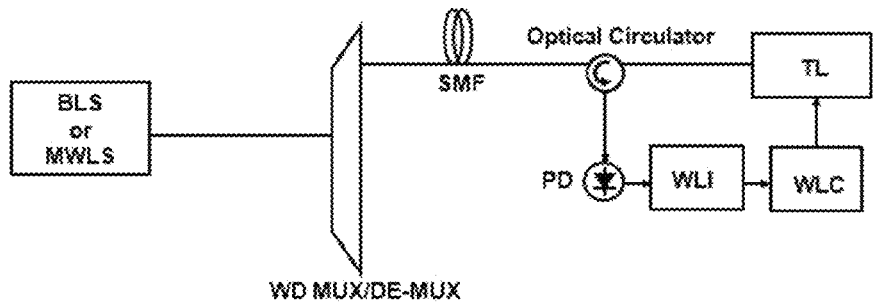
FIG. 10 illustrates a view of schematic block diagram for explaining a structure and its operations of a device for controlling a lasing wavelength of a tunable laser, according to an alternative embodiment of the fourth embodiment of the present invention illustrated in FIG. 9.

FIG. 10 illustrates a view of schematic block diagram for explaining a structure and its operations of a device for controlling a lasing wavelength of a tunable laser, according to an alternative embodiment of the fourth embodiment of the present invention illustrated in FIG. 9.

Referring to FIG. 10, in the alternative embodiment of the present invention illustrated in FIG. 10 has substantially the same structure of the fourth embodiment illustrated in FIG. 9, except that an optical circulator is used instead of the optical coupler. Accordingly, a detailed description of a specific structure and its operations of the alternative embodiment illustrated in FIG. 10 will be omitted.

In the fourth embodiment and the alternative embodiment of the present invention illustrated in FIGS. 9 and 10 described above, the PD and the WLI are illustrated illustratively as separate components from each other. However, any skilled person in the art will fully understand that the PD and the WLI illustrated in FIGS. 9 and 10 can be embodied by a single optical wavelength measuring device or a single optical spectrum analyzer capable of measuring a difference between the wavelength of the second light being de-multiplexed and inputted by the WD MUX/DE-MUX and the wavelength of the first light of the tunable laser.

Figure 11:
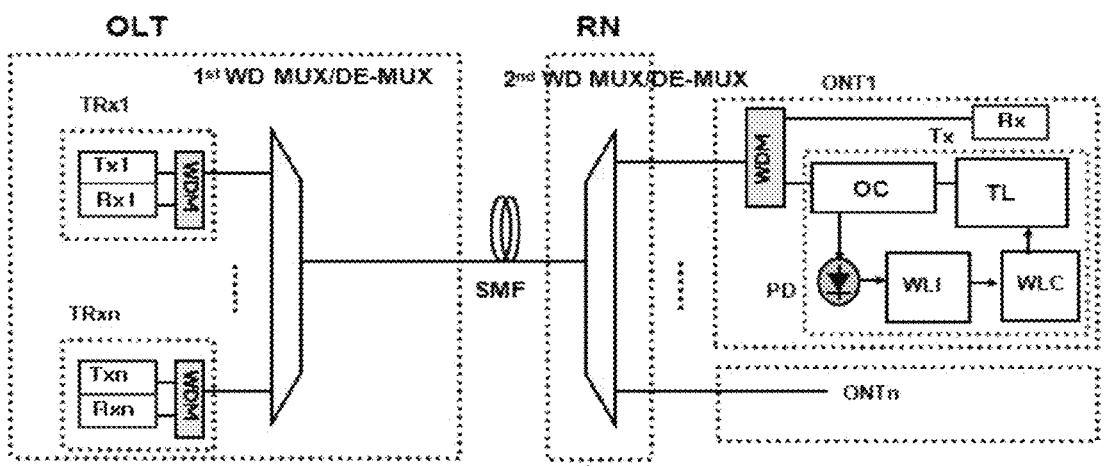
FIGS. 11 and 12 illustrate a view of a structure of a device for controlling a lasing wavelength of a tunable laser and a WDM-PON having the same, respectively, according to the first embodiment of the present invention illustrated in FIG. 1.
Figure 12:
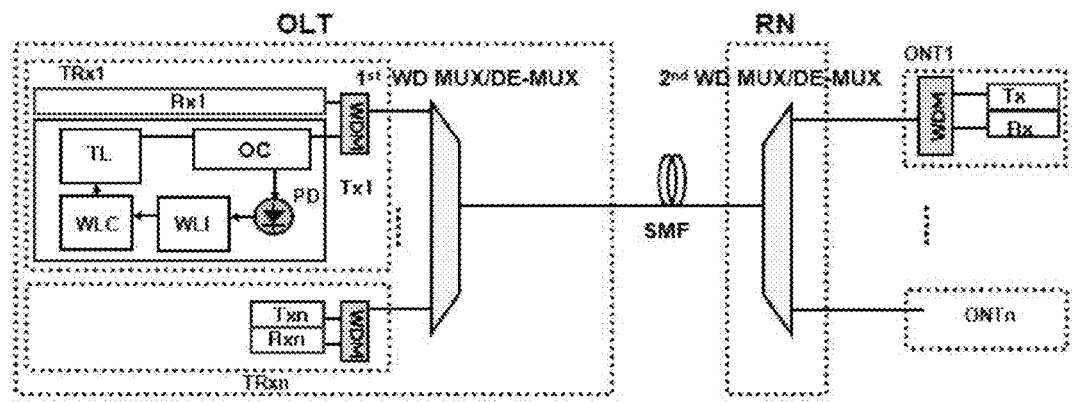

FIGS. 11 and 12 illustrate a view of a structure of a device for controlling a lasing wavelength of a tunable laser and a WDM-PON having the same, respectively, according to the first embodiment of the present invention illustrated in FIG. 1.

Referring to FIG. 11, a WDM-PON according to the first embodiment of the present invention comprises an optical line termination (OLT) comprising n-numbered first optical transceivers (TRx1, ..., TRxn) comprising n-numbered first optical transmitters (Tx1, ..., Txn) and n-numbered first optical receivers (Rx1, ..., Rxn); n-numbered first WDM filters, being connected to the n-numbered first optical transceivers (TRx1, ..., TRxn), respectively, for splitting a band of a transmitting signal; and a first WD MUX/DE-MUX, being connected to the n-numbered first WDM filters, for multiplexing and de-multiplexing the transmitting signal; a remote node (RN) including a second WD MUX/DE-MUX for multiplexing and de-multiplexing the transmitting signal; a single mode fiber (SMF) for connecting the first WD MUX/DE-MUX and the second WD MUX/DE-MUX; and n-numbered optical network terminations (ONTs) (ONT1, ..., ONTn) being respectively connected to the RN. Herein, the n-numbered ONTs (ONT1, ..., ONTn) respectively comprise a second optical transceiver (TRx) comprising a second optical transmitter (Tx) and a second optical receiver (Rx); and a second WDM filter, being connected to the second optical transceiver (TRx), for splitting the band of the transmitting signal, wherein the second optical transmitter (Tx) comprises a tunable laser (TL) for outputting a first light; an optical coupler (OC), being provided between the second WDM filter and the TL, for receiving and outputting the first light, and for being inputted and outputting a reflected optical component of the first light which is backscattered or reflected from the SMF; a photodiode (PD), being connected to the OC, for converting the reflected optical component into an electric signal upon receipt thereof and for outputting the converted electric signal; a wavelength identifier (WLI), being connected to the PD, for identifying a lasing wavelength of the TL upon receipt of the converted electric signal and for outputting an identifying signal; and a wavelength controller (WLC), being connected to the WLI, for controlling the lasing wavelength of the TL upon receipt of the identifying signal.

In the embodiment illustrated in FIG. 11, the WLI identifies the lasing wavelength of the TL by using, for example, a maximum power characteristic upon receipt of the converted electric signal, and outputs an identifying signal so that it is able to control the lasing wavelength of the TL. That is, in case that the lasing wavelength of the TL matches the transmission wavelength of the WD MUX/DE-MUX, the intensity of the reflected optical component of the first light, which is inputted into the PD and is backscattered or reflected, becomes maximum. The WLI identifies that the lasing wavelength of the TL matches the transmission wavelength of the WD MUX/DE-MUX at the moment that the power of the electric signal outputted from the PD becomes maximum, and transmits the identifying signal to the WLC so as to match the lasing wavelength of the TL with the transmission wavelength of the WD MUX/DE-MUX.

The embodiment illustrated in FIG. 11 describes a case that a device for controlling a lasing wavelength of a tunable laser is used at the ONTs when transmitting a signal from the ONTs to the OLT. However, any skilled person in the art may fully understand that it can be applicable to a case that a device for controlling a lasing wavelength of a tunable laser can be used at the OLT when transmitting a signal from the OLT to the ONTs, as illustrated in FIG. 12.

More specifically, referring to FIG. 12, a WDM-PON according to an alternative embodiment of the first embodiment of the present invention comprises an optical line termination (OLT) comprising n-numbered first optical transceivers (TRx1, ..., TRxn) comprising n-numbered first optical transmitters (Tx1, ..., Txn) and n-numbered first optical receivers (Rx1, ..., Rxn); n-numbered first WDM filters, being connected to the n-numbered first optical transceivers (TRx1, ..., TRxn), respectively, for splitting a band of a transmitting signal; and a first WD MUX/DE-MUX, being connected to the n-numbered first WDM filters, for multiplexing and de-multiplexing the transmitting signal; a remote node (RN) including a second WD MUX/DE-MUX for multiplexing and de-multiplexing the transmitting signal; a single mode fiber (SMF) for connecting the first WD MUX/DE-MUX and the second WD MUX/DE-MUX; and n-numbered optical network terminations (ONTs) (ONT1, ..., ONTn) being respectively connected to the RN and respectively comprising a second optical transceiver (TRx) comprising a second optical transmitter (Tx) and a second optical receiver (Rx); and a second WDM filter, being connected to the second optical transceiver (TRx), for splitting the band of the transmitting signal. Herein, the n-numbered first optical transmitters (Tx1, ..., Txn) respectively comprise a tunable laser (TL) for outputting a first light; an optical coupler (OC), being provided between the first WDM filter and the TL, for receiving and outputting the first light, and for being inputted and outputting a reflected optical component of the first light which is backscattered or reflected from the SMF; a photodiode (PD), being connected to the OC, for converting the reflected optical component into an electric signal upon receipt thereof and for outputting the converted electric signal; a wavelength identifier (WLI), being connected to the PD, for identifying a lasing wavelength of the TL upon receipt of the converted electric signal and for outputting an identifying signal; and a wavelength controller (WLC), being connected to the WLI, for controlling the lasing wavelength of the TL upon receipt of the identifying signal.

In the meanwhile, it is illustratively described in the embodiments illustrated in FIGS. 11 and 12 that the OC is used as a component of the device for controlling a lasing wavelength of the tunable laser illustrated in FIG. 1. However, any skilled person in the art may fully understand that an optical circulator illustrated in FIG. 2, an optical splitter/reflector illustrated in FIG. 3, or an optical splitter/combiner illustrated in FIG. 5 can be used instead of the OC illustrated in FIGS. 11 and 12.

Figure 13:
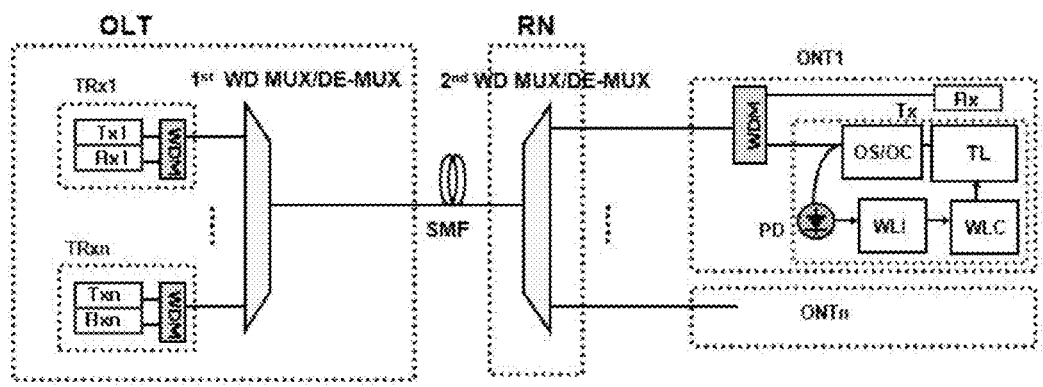
FIGS. 13 and 14 illustrate a view of a structure of a device for controlling a lasing wavelength of a tunable laser and a WDM-PON having the same, respectively, according to the second embodiment of the present invention illustrated in FIG. 5.
Figure 14:
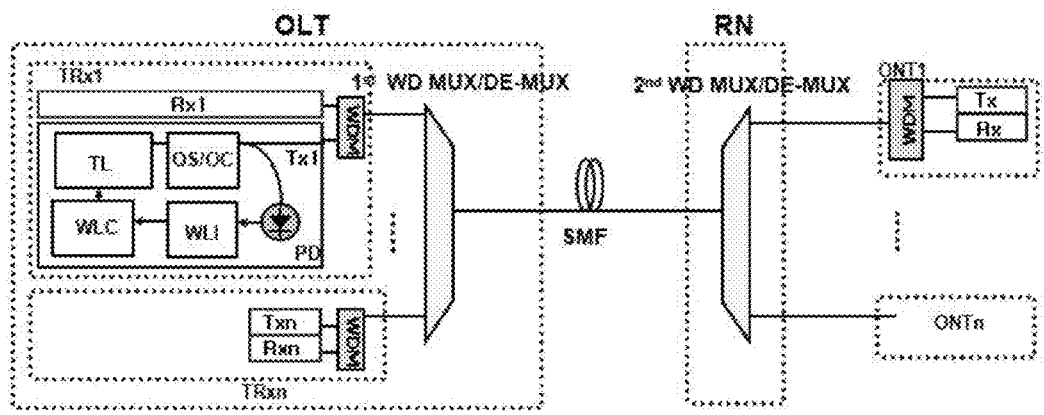

FIGS. 13 and 14 illustrate a view of a structure of a device for controlling a lasing wavelength of a tunable laser and a WDM-PON having the same, respectively, according to the second embodiment of the present invention illustrated in FIG. 5.

Referring to FIG. 13, a WDM-PON according to a second embodiment of the present invention comprises an optical line termination (OLT) comprising n-numbered first optical transceivers (TRx1, ..., TRxn) comprising n-numbered first optical transmitters (Tx1, ..., Txn) and n-numbered first optical receivers (Rx1, ..., Rxn); n-numbered first WDM filters, being connected to the n-numbered first optical transceivers (TRx1, ..., TRxn), respectively, for splitting a band of a transmitting signal; and a first WD MUX/DE-MUX, being connected to the n-numbered first WDM filters, for multiplexing and de-multiplexing the transmitting signal; a remote node (RN) including a second WD MUX/DE-MUX for multiplexing and de-multiplexing the transmitting signal; a single mode fiber (SMF) for connecting the first WD MUX/DE-MUX and the second WD MUX/DE-MUX; and n-numbered optical network terminations (ONTs) (ONT1, ..., ONTn) being respectively connected to the RN. Herein, the n-numbered ONTs (ONT1, ..., ONTn) respectively comprise a second optical transceiver (TRx) comprising a second optical transmitter (Tx) and a second optical receiver (Rx); and a second WDM filter, being connected to the second optical transceiver (TRx), for splitting the band of the transmitting signal, wherein the second optical transmitter (Tx) comprises a tunable laser (TL) for outputting a first light; an optical splitter/combiner (OS/OC), being provided between the second WDM filter and the TL, for receiving and splitting the first light and a reflected optical component of the first light which is backscattered or reflected from the SMF and for combining a portion of the first light and the reflected optical component and outputting a combined light; a photodiode (PD), being connected to the OS/OC, for converting the combined light into an electric signal upon receipt thereof and for outputting the converted electric signal; a wavelength identifier (WLI), being connected to the PD, for identifying a lasing wavelength of the TL by using noise of an optical beating component or a frequency difference between the first light and the reflected optical component upon receipt of the converted electric signal and for outputting an identifying signal; and a wavelength controller (WLC), being connected to the WLI, for controlling the lasing wavelength of the TL upon receipt of the identifying signal.

The embodiment illustrated in FIG. 13 describes a case that a device for controlling a lasing wavelength of a tunable laser is used at the ONTs when transmitting a signal from the ONTs to the OLT. However, any skilled person in the art may fully understand that it can be applicable to a case that a device for controlling a lasing wavelength of a tunable laser can be used at the OLT when transmitting a signal from the OLT to the ONTs, as illustrated in FIG. 14.

More specifically, referring to FIG. 14, a WDM-PON according to an alternative embodiment of the second embodiment of the present invention comprises an optical line termination (OLT) comprising n-numbered first optical transceivers (TRx1, . . . , TRxn) comprising n-numbered first optical transmitters (Tx1, . . . , Txn) and n-numbered first optical receivers (Rx1, . . . , Rxn); n-numbered first WDM filters, being connected to the n-numbered first optical transceivers (TRx1, . . . , TRxn), respectively, for splitting a band of a transmitting signal; and a first WD MUX/DE-MUX, being connected to the n-numbered first WDM filters, for multiplexing and de-multiplexing the transmitting signal; a remote node (RN) including a second WD MUX/DE-MUX for multiplexing and de-multiplexing the transmitting signal; a single mode fiber (SMF) for connecting the first WD MUX/DE-MUX and the second WD MUX/DE-MUX; and n-numbered optical network terminations (ONTs) (ONT1, . . . , ONTn) being respectively connected to the RN and respectively comprising a second optical transceiver (TRx) comprising a second optical transmitter (Tx) and a second optical receiver (Rx), and a second WDM filter, being connected to the second transceiver (TRx), for splitting the band of the transmitting signal. Herein, the n-numbered first optical transmitters (Tx1, . . . , Txn) respectively comprise a tunable laser (TL) for outputting a first light; an optical splitter/combiner (OS/OC), being provided between the first WDM filter and the TL, for receiving and splitting the first light and a reflected optical component of the first light which is backscattered or reflected from the SMF and for combining a portion of the first light and the reflected optical component and outputting a combined light; a photodiode (PD), being connected to the OS/OC, for converting the combined light into an electric signal upon receipt thereof and for outputting the converted electric signal; a wavelength identifier (WLI), being connected to the PD, for identifying a lasing wavelength of the TL by using noise of an optical beating component or a frequency difference between the first light and the reflected optical component upon receipt of the converted electric signal and for outputting an identifying signal; and a wavelength controller (WLC), being connected to the WLI, for controlling the lasing wavelength of the TL upon receipt of the identifying signal.

In the meanwhile, it is illustratively described in the embodiments illustrated in FIGS. 13 and 14 that the OS/OC is used as a component of the device for controlling a lasing wavelength of the tunable laser illustrated in FIG. 5. However, any skilled person in the art may fully understand that a 2×2 optical splitter/combiner and an optical reflector illustrated in FIG. 6 can be used instead of the OS/OC illustrated in FIGS. 13 and 14.

Figure 15:
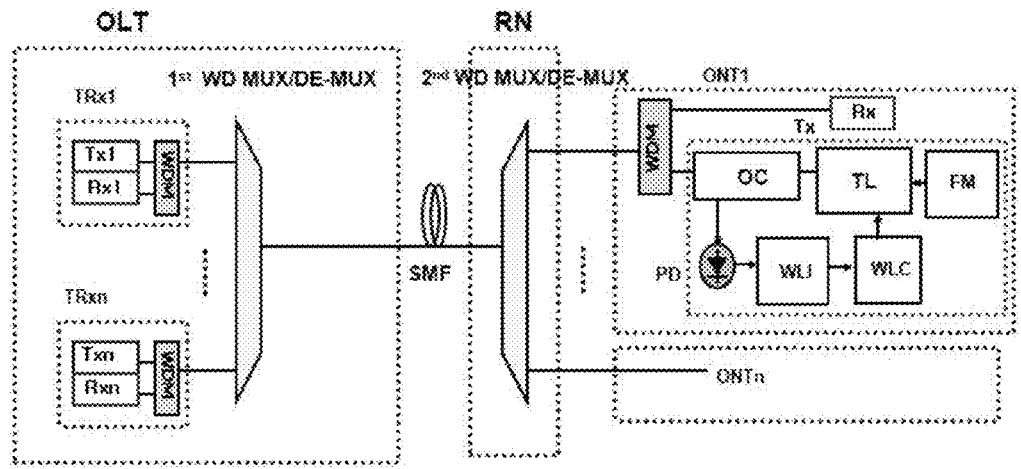
FIGS. 15 and 16 illustrate a view of a structure of a device for controlling a lasing wavelength of a tunable laser and a WDM-PON having the same, respectively, according to the third embodiment of the present invention illustrated in FIG. 7.
Figure 16:
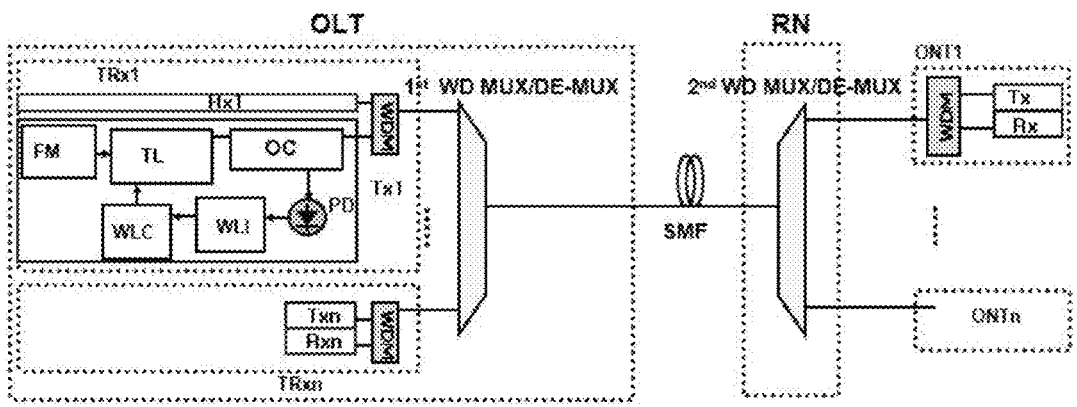

FIGS. 15 and 16 illustrate a view of a structure of a device for controlling a lasing wavelength of a tunable laser and a WDM-PON having the same, respectively, according to the third embodiment of the present invention illustrated in FIG. 7.

Referring to FIG. 15, a WDM-PON according to a third embodiment of the present invention comprises an optical line termination (OLT) comprising n-numbered first optical transceivers (TRx1, . . . , TRxn) comprising n-numbered first optical transmitters (Tx1, . . . , Txn) and n-numbered first optical receivers (Rx1, . . . , Rxn); n-numbered first WDM filters, being connected to the n-numbered first optical transceivers (TRx1, . . . , TRxn), respectively, for splitting a band of a transmitting signal; and a first WD MUX/DE-MUX, being connected to the n-numbered first WDM filters, for multiplexing and de-multiplexing the transmitting signal; a remote node (RN) including a second WD MUX/DE-MUX for multiplexing and de-multiplexing the transmitting signal; a single mode fiber (SMF) for connecting the first WD MUX/DE-MUX and the second WD MUX/DE-MUX; and n-numbered optical network terminations (ONTs) (ONT1, . . . , ONTn) being respectively connected to the RN. Herein, the n-numbered ONTs (ONT1, . . . , ONTn) respectively comprise a second optical transceiver (TRx) comprising a second optical transmitter (Tx) and a second optical receiver (Rx); and a second WDM filter, being connected to the second optical transceiver (TRx), for splitting the band of the transmitting signal, wherein the second optical transmitter (Tx) comprises a tunable laser (TL) for outputting a first light; an optical coupler (OC), being provided between the second WDM filter and the TL, for receiving and outputting the first light and for being inputted and outputting a reflected optical component of the first light which is backscattered or reflected from the SMF; a photodiode (PD), being connected to the OC, for converting the reflected optical component into an electric signal upon receipt thereof and for outputting the converted electric signal; a wavelength identifier (WLI), being connected to the PD, for identifying a lasing wavelength of the TL upon receipt of the converted electric signal and for outputting an identifying signal; a wavelength controller (WLC), being connected to the WLI, for controlling the lasing wavelength of the TL upon receipt of the identifying signal; and a frequency modulator (FM), being connected to the TL, for modulating the frequency of the TL either by using the WLI or by itself.

The embodiment illustrated in FIG. 15 describes a case that a device for controlling a lasing wavelength of a tunable laser is used at the ONTs when transmitting a signal from the ONTs to the OLT. However, any skilled person in the art may fully understand that it can be applicable to a case that a device for controlling a lasing wavelength of a tunable laser can be used at the OLT when transmitting a signal from the OLT to the ONTs, as illustrated in FIG. 16.

More specifically, referring to FIG. 16, a WDM-PON according to an alternative embodiment of the third embodiment of the present invention comprises an optical line termination (OLT) comprising n-numbered first optical transceivers (TRx1, . . . , TRxn) comprising n-numbered first optical transmitters (Tx1, . . . , Txn) and n-numbered first optical receivers (Rx1, . . . , Rxn); n-numbered first WDM filters, being connected to the n-numbered first optical transceivers (TRx1, . . . , TRxn), respectively, for splitting a band of a transmitting signal; and a first WD MUX/DE-MUX, being connected to the n-numbered first WDM filters, for multiplexing and de-multiplexing the transmitting signal; a remote node (RN) including a second WD MUX/DE-MUX for multiplexing and de-multiplexing the transmitting signal;

a single mode fiber (SMF) for connecting the first WD MUX/DE-MUX and the second WD MUX/DE-MUX; and n-numbered optical network terminations (ONTs) (ONT1, ..., ONTn), being respectively connected to the RN and respectively comprising a second optical transceiver (TRx) comprising a second optical transmitter (Tx) and a second optical receiver (Rx), and a second WDM filter, being connected to the second transceiver (TRx), for splitting the band of the transmitting signal. Herein, the n-numbered first optical transmitters (Tx1, ..., Txn) respectively comprise a tunable laser (TL) for outputting a first light; an optical coupler (OC), being provided between the first WDM filter and the TL, for receiving and outputting the first light and for being inputted and outputting a reflected optical component of the first light which is backscattered or reflected from the SMF; a photodiode (PD), being connected to the OC, for converting the reflected optical component into an electric signal upon receipt thereof and for outputting the converted electric signal; a wavelength identifier (WLI), being connected to the PD, for identifying a lasing wavelength of the TL upon receipt of the converted electric signal and for outputting an identifying signal; a wavelength controller (WLC), being connected to the WLI, for controlling the lasing wavelength of the TL upon receipt of the identifying signal; and a frequency modulator (FM), being connected to the TL, for modulating the frequency of the TL either by using the WLI or by itself.

In the meanwhile, it is illustratively described in the embodiments illustrated in FIGS. 15 and 16 that the OC is used as a component of the device for controlling a lasing wavelength of the tunable laser illustrated in FIG. 7. However, any skilled person in the art may fully understand that an optical circulator illustrated in FIG. 2, an optical splitter/reflector illustrated in FIG. 3, or an optical splitter/combiner illustrated in FIG. 5 can be used instead of the OC illustrated in FIGS. 15 and 16.

Figure 17:
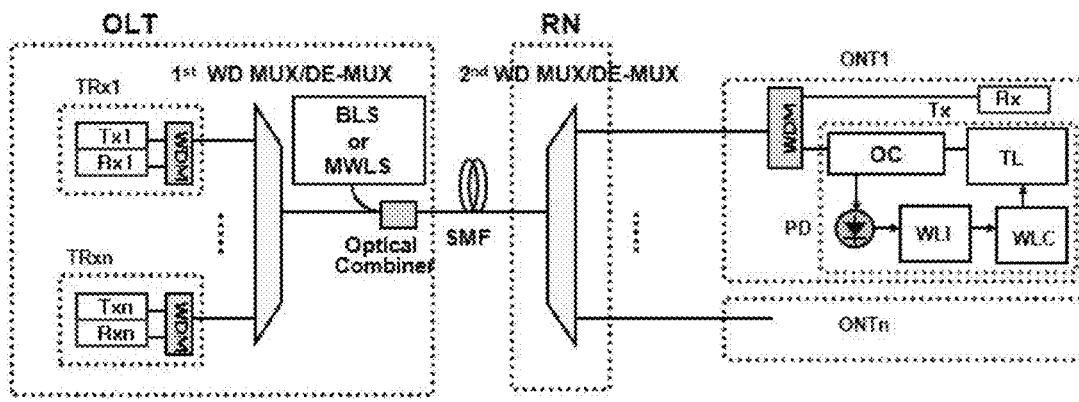
FIGS. 17 to 19 illustrate a view of a structure of a device for controlling a lasing wavelength of a tunable laser and a WDM-PON having the same, respectively, according to the fourth embodiment of the present invention illustrated in FIG. 9.
Figure 18:
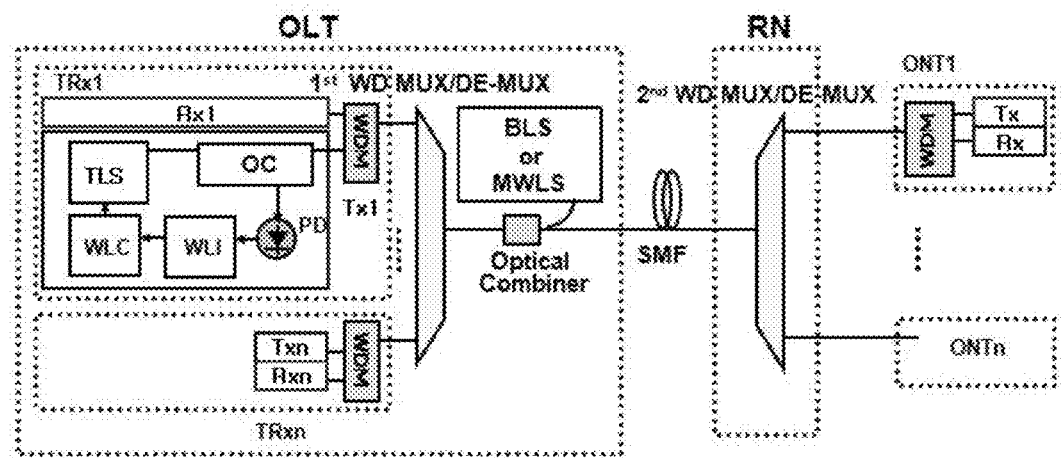
Figure 19:
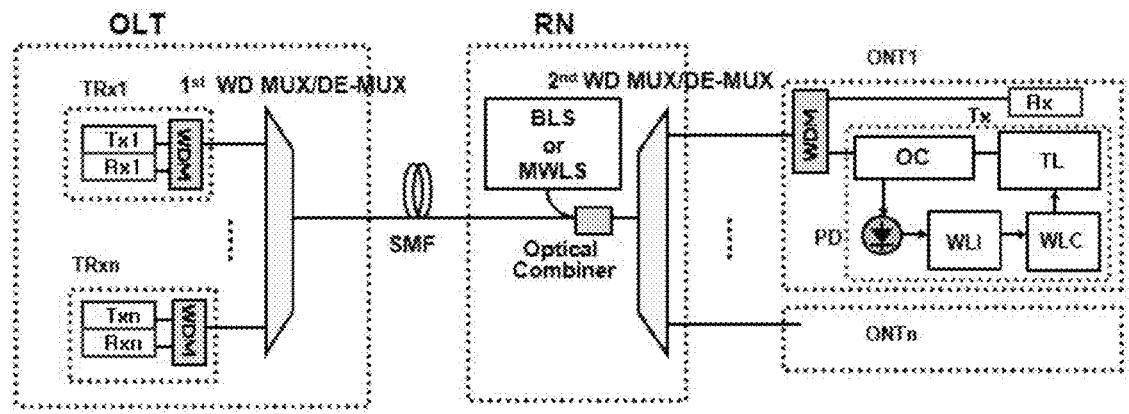

FIGS. 17 to 19 illustrate a view of a structure of a device for controlling a lasing wavelength of a tunable laser and a WDM-PON having the same, respectively, according to a fourth embodiment of the present invention illustrated in FIG. 9.

Referring to FIG. 17, a WDM-PON according to the fourth embodiment of the present invention comprises an optical line termination (OLT) comprising n-numbered first optical transceivers (TRx1, ..., TRxn) comprising n-numbered first optical transmitters (Tx1, ..., Txn) and n-numbered first optical receivers (Rx1, ..., Rxn); n-numbered first WDM filters, being connected to the n-numbered first optical transceivers (TRx1, ..., TRxn), respectively, for splitting a band of a transmitting signal; a first WD MUX/DE-MUX, being connected to the n-numbered first WDM filters, for multiplexing and de-multiplexing the transmitting signal; a light source for outputting a second light; and an optical combiner, being connected to the first WD MUX/DE-MUX and the light source, respectively, for combining the transmitting signal being multiplexed at the first MUX/DE-MUX and the second light being outputted from the light source; a remote node (RN) including a second WD MUX/DE-MUX for multiplexing and de-multiplexing the transmitting signal; a single mode fiber (SMF) for connecting the optical combiner and the second WD MUX/DE-MUX; and n-numbered optical network terminations (ONTs) (ONT1, ..., ONTn) being respectively connected to the RN. Herein, the n-numbered ONTs (ONT1, ..., ONTn) respectively comprise a second optical transceiver (TRx) comprising a second optical transmitter (Tx) and a second optical receiver (Rx); and a second WDM filter, being connected to the second transceiver (TRx), for splitting the band of the transmitting signal, wherein the second optical transmitter (Tx) comprises a tunable laser (TL) for outputting a first light; an optical coupler (OC), being provided between the second WDM filter and the TL, for combining a portion of the second light, a reflected optical component of the first light which is backscattered or reflected from the SMF, and a portion of the first light which is reflected from the second WD MUX/DE-MUX and for outputting a combined light; a photodiode (PD), being connected to the OC, for converting the combined light into an electric signal upon receipt thereof and for outputting the converted electric signal; a wavelength identifier (WLI), being connected to the PD, for identifying a lasing wavelength of the TL by using noise of an optical beating component or a frequency difference between the reflected optical component and the de-multiplexed second light upon receipt of the converted electric signal and for outputting an identifying signal; and a wavelength controller (WLC), being connected to the WLI, for controlling the lasing wavelength of the TL upon receipt of the identifying signal.

The embodiment illustrated in FIG. 17 describes a case that a device for controlling a lasing wavelength of a tunable laser is used at the ONTs when transmitting a signal from the ONTs to the OLT. However, any skilled person in the art may fully understand that it can be applied to a case that a device for controlling a lasing wavelength of a tunable laser can be used at the OLT when transmitting a signal from the OLT to the ONTs, as illustrated in FIG. 18.

More specifically, referring to FIG. 18, a WDM-PON according to a first alternative embodiment of the fourth embodiment of the present invention comprises an optical line termination (OLT) comprising n-numbered first optical transceivers (TRx1, ..., TRxn) comprising n-numbered first optical transmitters (Tx1, ..., Txn) and n-numbered first optical receivers (Rx1, ..., Rxn); n-numbered first WDM filters, being connected to the n-numbered first optical transceivers (TRx1, ..., TRxn), respectively, for splitting a band of a transmitting signal; a first WD MUX/DE-MUX, being connected to the n-numbered first WDM filters, for multiplexing and de-multiplexing the transmitting signal; a light source for outputting a second light; and an optical combiner being connected to the first WD MUX/DE-MUX and the light source, respectively; a remote node (RN) including a second WD MUX/DE-MUX for multiplexing and de-multiplexing the transmitting signal; a single mode fiber (SMF) for connecting the optical combiner and the second WD MUX/DE-MUX; and n-numbered optical network terminations (ONTs) (ONT1, ..., ONTn) being respectively connected to the RN and respectively comprising a second optical transceiver (TRx) comprising a second optical transmitter (Tx) and a second optical receiver (Rx); and a second WDM filter, being connected to the second transceiver (TRx), for splitting the band of the transmitting signal, wherein the optical combiner combines the transmitting signal being de-multiplexed at the second WD MUX/DE-MUX and the second light being outputted from the light source. Herein, the n-numbered first optical transmitters (Tx1, ..., Txn) respectively comprise a tunable laser (TL) for outputting a first light; an optical coupler (OC), being provided between the first WDM filter and the TL, for combining a portion of the second light which is de-multiplexed by the first WD MUX/DE-MUX, a reflected optical component of the first light which is backscattered or reflected from the SMF, and a portion of the first light which is reflected from the first WD MUX/DE-MUX and for outputting a combined light; a photodiode (PD), being connected to the OC, for converting the combined light into an electric signal upon receipt thereof and for outputting the converted electric signal; a wavelength identifier (WLI), being connected to the PD, for identifying a lasing wavelength of the TL by using noise of an optical beating component or a frequency difference between the reflected optical component and the de-multiplexed second light upon receipt of the converted electric signal and for outputting an identifying signal; and a wavelength controller (WLC), being connected to the WLI, for controlling the lasing wavelength of the TL upon receipt of the identifying signal.

In the meanwhile, it is illustratively described in the embodiments illustrated in FIGS. 17 and 18 that the light source (for example, a multiple wavelength light source (MWLS) or a broadband light source (BLS)) is positioned within the OLT. However, any skilled person in the art may fully understand that it can be applicable to a case that the light source (for example, a MWLS or a BLS) is positioned within the RN, as illustrated in FIG. 19.

More specifically, referring to FIG. 19, a WDM-PON according to a second alternative embodiment of the fourth embodiment of the present invention comprises an optical line termination (OLT) comprising n-numbered first optical transceivers (TRx1, . . . , TRxn) comprising n-numbered first optical transmitters (Tx1, . . . , Txn) and n-numbered first optical receivers (Rx1, . . . , Rxn); n-numbered first WDM filters, being connected to the n-numbered first optical transceivers (TRx1, . . . , TRxn), respectively, for splitting a band of a transmitting signal; and a first WD MUX/DE-MUX, being connected to the n-numbered first WDM filters, for multiplexing and de-multiplexing the transmitting signal; a remote node (RN) including a second WD MUX/DE-MUX for multiplexing and de-multiplexing the transmitting signal; a light source for outputting a second light; an optical combiner, one side of which is connected to the second WD MUX/DE-MUX and a first input/output port of the other side of which is connected to the light source within the RN, for combining the transmitting signal being multiplexed at the first MUX/DE-MUX and the second light being outputted from the light source; a single mode fiber (SMF) for connecting the first WD MUX/DE-MUX and the optical combiner; and n-numbered optical network terminations (ONTs) (ONT1, . . . , ONTn) being respectively connected to the RN, wherein a second input/output port of the other side of the optical combiner is connected to the SMF. Herein, the n-numbered ONTs (ONT1, . . . , ONTn) respectively comprise a second optical transceiver (TRx) comprising a second optical transmitter (Tx) and a second optical receiver (Rx); and a second WDM filter, being connected to the second transceiver (TRx), for splitting the band of the transmitting signal, wherein the second optical transmitter (Tx) comprises a tunable laser (TL) for outputting a first light; an optical coupler (OC), being provided between the second WDM filter and the TL, for combining a portion of the second light which is de-multiplexed by the second WD MUX/DE-MUX, a reflected optical component of the first light which is back-scattered or reflected from the SMF, and a portion of the first light which is reflected from the second WD MUX/DE-MUX and for outputting a combined light; a photodiode (PD), being connected to the OC, for converting the combined light into an electric signal upon receipt thereof and for outputting the converted electric signal; a wavelength identifier (WLI), being connected to the PD, for identifying a lasing wavelength of the TL by using noise of an optical beating component or a frequency difference between the reflected optical component and the de-multiplexed second light upon receipt of the converted electric signal and for outputting an identifying signal; and a wavelength controller (WLC), being connected to the WLI, for controlling the lasing wavelength of the TL upon receipt of the identifying signal.

In the meanwhile, the second light outputted from the light source (for example, a MWLS or a BLS) must be injected into the TL in order to control the lasing wavelength to a desired wavelength in the embodiments illustrated in FIGS. 17 to 19 described above.

Further, it is illustratively described in the embodiments of the present invention illustrated in FIGS. 17 to 19 described above that the OC is used as a component of a device for controlling a lasing wavelength of a tunable laser illustrated in FIG. 9. However, any skilled person in the art may fully understand that an optical circulator illustrated in FIG. 2, an optical splitter/reflector illustrated in FIGS. 3 and 4, or an optical splitter/combiner illustrated in FIGS. 5 and 6 can be used instead of the OC illustrated in FIGS. 17 to 19.

Further, it is described in the embodiments of the present invention illustrated in FIGS. 11 to 19 that a device for controlling a lasing wavelength of a tunable laser of the present invention illustrated in FIGS. 1 to 10 is used for a WDM-PON. However, any skilled person in the art may fully understand that a device for controlling a lasing wavelength of a tunable laser of the present invention illustrated in FIGS. 1 to 10 can be applicable to a WDM optical transmission system, including a metro network or a backbone network, etc.

Further, the light source being used for the embodiments of the present invention can be embodied by a MWLS or a BLS. A Fabry-Perot Laser Diode (F-P LD), a distributed feed-back laser diode (DFB-LD) array comprising multiple DFB-LDs, etc. may be used as a MWLS. In addition, a reflective semiconductor optical amplifier (RSOA), an erbium-doped fiber amplifier (EDFA) emitting an amplified spontaneous emission (ASE), a high-powered light emitting diode (LED), a super luminescent diode (SLD), etc. may be used as a BLS.

Further, although it is described that a tunable laser is used in the embodiments of the present invention illustrated in FIGS. 1 to 13, any skilled person in the art may fully understand that a light source such as a DFB-LD, a distributed Bragg reflector (DBR) laser, an F-P LD, etc. may be used instead of the tunable laser. In addition, it may be fully understood that, as a tunable laser, a multi-mode laser diode having multiple injection electrodes disclosed in Korean Patent No. 0916858 entitled "a wavelength division multiplexed-passive optical network using a multi-mode laser diode having multiple injection electrodes," which was filed as Korean Patent Application no. 10-2007-0081062, on Aug. 13, 2008 and granted on Sep. 3, 2009.

Further, the WD MUX/DE-MUX, or the first WD MUX/DE-MUX and the second WD MUX/DE-MUX, being used in the embodiments of the present invention illustrated in FIGS. 1 to 13, are respectively embodied by an arrayed waveguide grating (AWG) or a thin-film filter, etc.

Although the present invention describes embodiments of a WDM-PON where a lasing wavelength of a tunable laser is automatically controlled, any skilled person in the art may fully understand that the embodiments of the present invention may be applicable to a general optical transmission system.

As various modifications could be made in the construction and method herein described and illustrated without departing from the scope of the present invention, it is intended that all matter contained in the foregoing description or shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

What is claimed is:

1. A device for controlling a lasing wavelength of a tunable laser comprising:
   a wavelength division multiplexer/de-multiplexer (WD MUX/DE-MUX);
   a single mode fiber (SMF) being connected to the WD MUX/DE-MUX;
   a tunable laser (TL) for outputting a first light to the WD MUX/DE-MUX;
   an optical coupler, being provided between the WD MUX/DE-MUX and the TL, for being inputted and outputting a reflected optical component of the first light which is backscattered or reflected from the SMF;
   a photodiode (PD), being connected to the optical coupler, for converting the reflected optical component into an electric signal upon receipt thereof and outputting the converted electric signal;
   a wavelength identifier (WLI), being connected to the PD, for identifying a difference between the lasing wavelength of the TL and a transmission wavelength of the WD MUX/DE-MUX upon receipt of the converted electric signal and outputting an identifying signal; and
   a wavelength controller (WLC), being connected to the WLI, for controlling the wavelengths of the TL upon receipt of the identifying signal.

2. The device for controlling a lasing wavelength of a tunable laser of claim 1, wherein the WLI identifies the lasing wavelength of the TL by using a maximum power characteristic upon receipt of the converted electric signal, and outputs an identifying signal.

3. The device for controlling a lasing wavelength of a tunable laser of claim 1, wherein the optical coupler is embodied by an optical circulator.

4. The device for controlling a lasing wavelength of a tunable laser of claim 1, further comprises an optical splitter/reflector, being provided between the SMF and the WD MUX/DE-MUX, for receiving and splitting a portion of the first light and outputting a reflected component of the first light.

5. The device for controlling a lasing wavelength of a tunable laser of claim 4, wherein the optical splitter/reflector comprises:
   a 1×2 optical coupler having a first input/output port provided at one side, and
   a second and a third input/output ports provided at the other side which is opposite to the one side,
   wherein the first input/output port is connected to the WD MUX/DE-MUX,
   wherein the second input/output port is connected to the SMF, and
   wherein the third input/output port is connected to the optical reflector.

6. A device for controlling a lasing wavelength of a tunable laser comprising:
   a wavelength division multiplexer/de-multiplexer (WD MUX/DE-MUX);
   a single mode fiber (SMF) connected to the WD MUX/DE-MUX;
   a tunable laser (TL) for outputting a first light into the WD MUX/DE-MUX;
   an optical splitter/combiner (OS/OC), being provided between the WD MUX/DE-MUX and the TL, for transmitting a first portion which is a portion of the first light to the WD MUX/DE-MUX, receiving and splitting a reflected optical component of the first portion of the first light, which is backscattered or reflected from the SMF, and for combining a second portion which is a remaining portion other than the first portion of the first light and the reflected optical component and outputting a combined light;
   a photodiode (PD), being connected to the OS/OC, for converting the combined light into an electric signal upon receipt thereof, and for outputting the converted electric signal;
   a wavelength identifier (WLI), being connected to the PD, for identifying a difference between the lasing wavelength of the TL and a transmission wavelength of the WD MUX/DE-MUX by using noise or a frequency difference of optical beating components generated depending on a wavelength difference between the second portion of the first light and the reflected optical component upon receipt of the converted electric signal and for outputting an identifying signal; and
   a wavelength controller (WLC), being connected to the WLI, for controlling the lasing wavelength of the TL upon receipt of the identifying signal.

7. The device for controlling a lasing wavelength of a tunable laser of claim 6, wherein the OS/OC comprises:
   a 2×2 optical coupler having a first and a second input/output ports which are provided at one side, and a third and a fourth input/output ports which are provided at the other side which is opposite to one side; and
   an optical reflector being connected to the 2×2 optical coupler,
   wherein the first input/output port is connected to the WD MUX/DE-MUX,
   wherein the second input/output port is connected to the PD,
   wherein the third input/output port is connected to the TL, and
   wherein the fourth input/output port is connected to the optical reflector.

8. A device for controlling a lasing wavelength of a tunable laser comprising:
   a wavelength division multiplexer/de-multiplexer (WD MUX/DE-MUX);
   a single mode fiber (SMF) being connected to the WD MUX/DE-MUX;
   a tunable laser (TL) for outputting a first light to the WD MUX/DE-MUX;
   a frequency modulator (FM), being connected to the TL, for modulating the first light by a first frequency to output a first modulated light;
   an optical coupler (OC), being provided between the WD MUX/DE-MUX and the TL for being inputted and outputting a reflected optical component of the first modulated light which is backscattered or reflected from the SMF;
   a photodiode (PD), being connected to the OC, for converting the reflected optical component into an electric signal upon receipt thereof and outputting the converted electric signal;
   a wavelength identifier (WLI), being connected to the PD, for detecting a maximum value of optical power of the reflected optical component of the first modulated light, or a phase between the first modulated light and the reflected optical component of the first modulated light and identifying the lasing wavelength of the tunable laser signal and for outputting an identifying signal, upon receipt of the converted electric signal; and
   a wavelength controller (WLC), being connected to the WLI, for controlling the wavelengths of the TL upon receipt of the identifying signal.

9. The device for controlling a lasing wavelength of a tunable laser of claim 8, wherein, in case that the WLI detects a maximum value of optical power two times for one modulation period of the first frequency, the WLI transmits the identifying signal identifying that the lasing wavelength of the TL matches with a transmission wavelength of the WD MUX/DE-MUX to the WLC, and wherein the WLC matches the lasing wavelength with the transmission wavelength.

10. The device for controlling a lasing wavelength of a tunable laser of claim 8, wherein, when the WLI detects the maximum value of optical power one time for one modulation period of the first frequency, the WLI identifies whether the frequency or the wavelength of the TL is increased or decreed by measuring the phase.

* * * * *